(12) United States Patent
Koizumi et al.

(10) Patent No.: US 8,636,945 B2
(45) Date of Patent: Jan. 28, 2014

(54) METHOD FOR PRODUCING CRYSTALLINE PARTICLES AND METHOD FOR PRODUCING CRYSTALLOGRAPHICALLY ORIENTED CERAMIC

(75) Inventors: Takaaki Koizumi, Tajimi (JP); Takuya Katsuno, Nagoya (JP); Hideki Shimizu, Ohbu (JP)

(73) Assignee: NGK Insulators, Ltd., Nagoya (JP)

( * ) Notice: Subject to any disclaimer, the term of this patent is extended or adjusted under 35 U.S.C. 154(b) by 531 days.

(21) Appl. No.: 12/825,637

(22) Filed: Jun. 29, 2010

(65) Prior Publication Data

US 2011/0014362 A1    Jan. 20, 2011

(30) Foreign Application Priority Data

Jul. 16, 2009  (JP) ................... 2009-167721
May 17, 2010  (JP) ................... 2010-113576

(51) Int. Cl.
    *B28B 1/14*     (2006.01)
(52) U.S. Cl.
    USPC ............................ 264/614; 264/603; 264/650
(58) Field of Classification Search
    USPC ........................................ 264/603, 614, 650
    See application file for complete search history.

(56) References Cited

U.S. PATENT DOCUMENTS

| | | | | |
|---|---|---|---|---|
| 4,626,369 A * | 12/1986 | Walker, Jr. | ............. | 252/62.9 PZ |
| 7,678,290 B2 * | 3/2010 | Hammer-Altmann et al. | ............. | 252/62.9 PZ |
| 7,785,659 B2 * | 8/2010 | Nihei | ............. | 427/100 |
| 8,237,338 B2 * | 8/2012 | Koizumi et al. | ............. | 310/358 |
| 2003/0067509 A1 * | 4/2003 | Sakamaki et al. | ............. | 347/68 |
| 2004/0071883 A1 * | 4/2004 | Ogawa et al. | ............. | 427/378 |
| 2004/0253746 A1 * | 12/2004 | Nakagawa et al. | ............. | 438/3 |
| 2006/0027847 A1 * | 2/2006 | Koo et al. | ............. | 257/295 |
| 2006/0223244 A1 * | 10/2006 | Nihei | ............. | 438/166 |
| 2008/0206561 A1 | 8/2008 | Yokoyama et al. | | |
| 2008/0237531 A1 * | 10/2008 | Tsukada et al. | ............. | 252/62.9 PZ |
| 2008/0248277 A1 | 10/2008 | Yokoyama et al. | | |
| 2010/0071179 A1 * | 3/2010 | Koizumi et al. | ............. | 29/25.35 |
| 2010/0301703 A1 * | 12/2010 | Chen et al. | ............. | 310/318 |
| 2011/0014362 A1 * | 1/2011 | Koizumi et al. | ............. | 427/100 |

(Continued)

FOREIGN PATENT DOCUMENTS

JP   62-147606 A1   7/1987
JP   2001-261435 A1   9/2001

(Continued)

OTHER PUBLICATIONS

Japanese Office Action (Application No. 2010-113576) dated Oct. 1. 2013 (with English translation).

*Primary Examiner* — Joseph S Del Sole
*Assistant Examiner* — Russell Kemmerle, III
(74) *Attorney, Agent, or Firm* — Burr & Brown, PLLC (57) ABSTRACT

A method for producing crystalline particles including a mixing step of producing a mixed material containing a lead-containing material and an additional material containing lithium and boron and a first firing step of firing the mixed material at a predetermined firing temperature to form polyhedral crystalline particles. The crystalline particles are used to produce a crystallographically oriented ceramic by preparing a template layer having uniform crystal orientation in a predetermined direction by fixing the crystalline particles on a substrate, forming a shaped body including a matrix layer arranged on the template layer, the matrix layer being composed of a mixed material that contains a lead-containing material and an additional material containing lithium and boron, and firing the shaped body.

8 Claims, 3 Drawing Sheets

(56) References Cited

U.S. PATENT DOCUMENTS

| | | | |
|---|---|---|---|
| 2011/0241479 A1* | 10/2011 | Koizumi et al. | 310/311 |
| 2011/0241493 A1* | 10/2011 | Koizumi et al. | 310/363 |
| 2011/0284387 A1* | 11/2011 | Koizumi | 205/109 |

FOREIGN PATENT DOCUMENTS

| | | |
|---|---|---|
| JP | 2006-298747 A1 | 11/2006 |
| JP | 2009-040672 A1 | 2/2009 |
| JP | 2009-046376 A1 | 3/2009 |

* cited by examiner

FIG. 3

METHOD FOR PRODUCING CRYSTALLINE PARTICLES AND METHOD FOR PRODUCING CRYSTALLOGRAPHICALLY ORIENTED CERAMIC

BACKGROUND OF THE INVENTION

1. Field of the Invention

The present invention relates to a method for producing crystalline particles and a method for producing a crystallographically oriented ceramic, and more specifically, it relates to a method for producing crystalline particles containing lead, the particles being used for a piezoelectric/electrostrictive body, and a method for producing a crystallographically oriented ceramic.

2. Description of the Related Art

Hitherto, regarding a method for producing a crystallographically oriented ceramic, it has been reported on a method including mixing polyhedral template particles and a raw material powder to increase the degree of orientation. For example, a method is reported in which a perovskite compound containing Bi, Na, and Ti is mechanically oriented by a shearing process such as tape casting with plate-like template crystalline particles each having an aspect ratio of 2 or more (for example, see Patent Document 1). Furthermore, it is reported that a method including forming a very thin self-supported ceramic sheet of a perovskite compound, performing firing, and performing disaggregation to form polycrystalline particles each having an aspect ratio of 2 or more in the ceramic sheet, mixing the polycrystalline particles with a raw material powder, and performing shearing step such as tape casting to mechanically orient the resulting ceramic (for example, see Patent Document 2).

[Patent Document]

[Patent Document 1] Japanese Unexamined Patent Application Publication No. 2001-261435

[Patent Document 2] Japanese Unexamined Patent Application Publication No. 2009-40672

SUMMARY OF THE INVENTION

However, in the production method described in Patent Document 1, although crystals such as bismuth layered compounds, which easily have a plate-like shape, can be used, it is difficult to prepare lead-containing crystals each having a large aspect ratio. In the production method described in Patent Documents 1 and 2, they are necessary to perform the shearing step such as tape casting. This disadvantageously limits the shape of the resulting crystallographically oriented ceramic.

The present invention has been made in light of the circumstances described above. It is a main object of the present invention to provide a method for producing crystalline particles. It is possible to more easily produce polyhedral crystalline particles containing lead by the method. Furthermore, it is another main object of the present invention to provide a method for producing a crystallographically oriented ceramic using the crystalline particles. It is possible to more easily produce a crystallographically oriented ceramic with a higher degree of orientation.

The inventors have conducted intensive studies in order to achieve the main object and have found that it is possible to more easily produce polyhedral crystalline particles by mixing a lead-containing material and an additional material containing lithium and boron, forming a shaped body, and performing firing. The findings have led to the completion of the present invention.

That is, a method for producing crystalline particles according to the present invention includes a mixing step of producing a mixed material containing a lead-containing material and an additional material containing lithium and boron; and a first firing step of firing the mixed material at a predetermined firing temperature to form polyhedral crystalline particles.

A method for producing a crystallographically oriented ceramic according to the present invention includes a preparation step of preparing a template layer having uniform crystal orientation in a predetermined direction by fixing crystalline particles composed of a lead-containing material on a substrate, the crystalline particles being produced by the above-mentioned method for producing crystalline particles;

a formation step of forming a shaped body including a matrix layer arranged on the template layer, the matrix layer being composed of a mixed material that contains a lead-containing material and an additional material containing lithium and boron; and a second firing step of firing the shaped body formed in the formation step at a predetermined firing temperature.

The method for producing crystalline particles according to the present invention enables us to more easily produce polyhedral crystalline particles. Furthermore, the method for producing a crystallographically oriented ceramic according to the present invention enables us to more easily produce a crystallographically oriented ceramic with a higher degree of orientation. The exact reason for this is unclear. The reason may be as follows: For example, in the case where the lead-containing material has an isotropic crystal structure, sphere-like particles are formed by a normal heat treatment. It is thus difficult to use the material as a template that imparts orientation. Here, the additional material containing lithium and boron probably functions to grow crystals of the lead-containing material in a polyhedral shape (e.g., a cube). With respect to the crystallographically oriented ceramic, it is speculated that the crystals of the material for the matrix layer are grown on the basis of the crystal orientation of the crystalline particles, so that the ceramic is more easily oriented. Moreover, it is possible to increase the degree of orientation of the lead-containing material by a simple method in which the matrix is formed on the template layer having uniform crystal orientation.

DETAILED DESCRIPTION OF THE INVENTION

Figure 1:
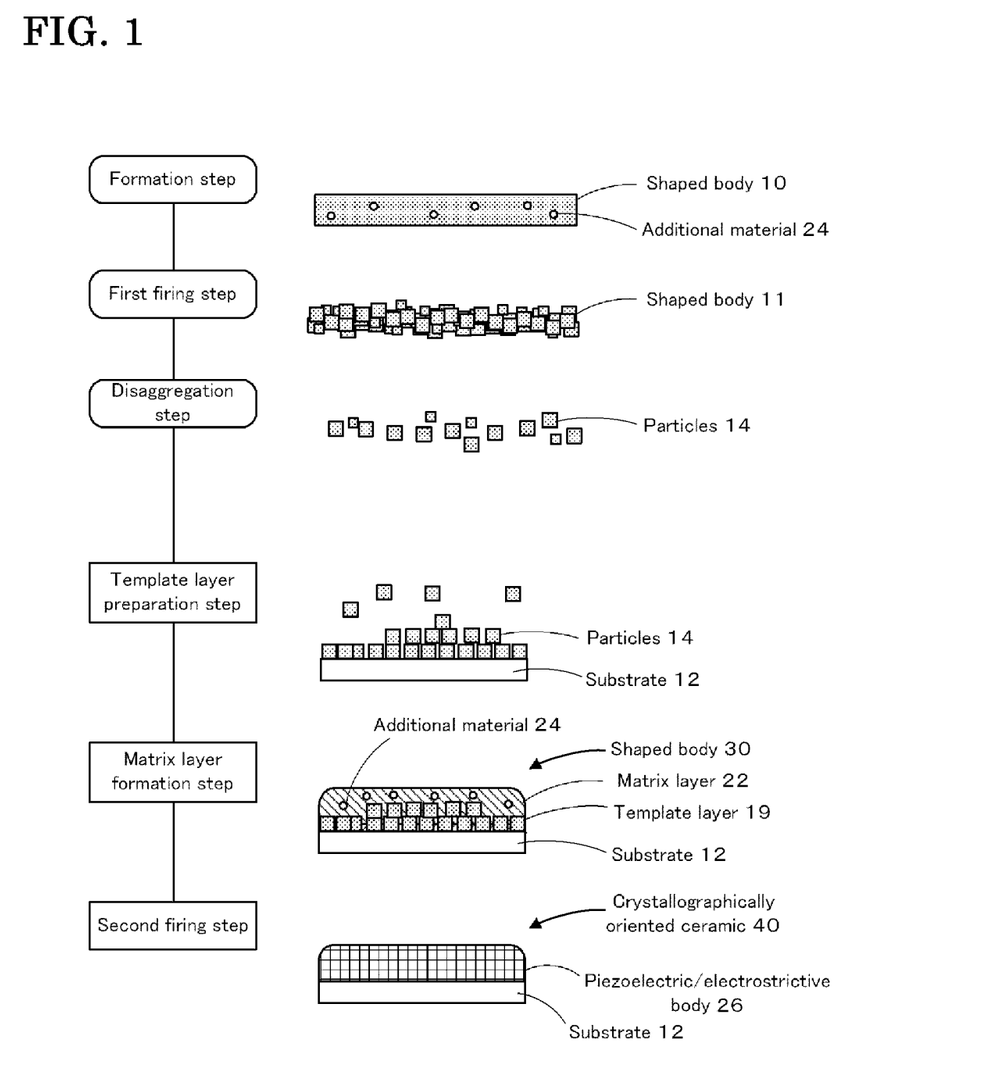
FIG. 1 is an explanatory view illustrating an exemplary method for producing particles 14 and a crystallographically oriented ceramic 40.

Embodiments for carrying out the present invention will be described below with reference to the drawings. FIG. 1 is an explanatory view illustrating an exemplary method for producing polyhedral crystalline particles (hereinafter, referred to as "particles 14") and an exemplary method for producing a crystallographically oriented ceramic 40. A method for producing the particles 14 may include (1) a mixing step of producing a mixed material containing a lead-containing material and an additional material containing lithium and boron, (2) a formation step of forming a shaped body composed of the mixed material, (3) a first firing step of firing the shaped body formed in the formation step at a firing temperature to form polyhedral crystalline particles, and (4) a disaggregation step of disaggregating the fired shaped body to yield crystalline particles.

(1) Mixing Step

In this step, the mixed material containing an additional material 24 containing lithium and boron and the lead-containing material is produced. Examples of the additional material 24 containing lithium and boron include $LiBO_2$, $Li_2B_4O_7$, $LiB(OH)_4$, $Li_3BO_3$, $Li_6B_4O_9$, $LiB_3O_5$, and $Li_2B_8O_{13}$. One or more of these materials may be used. Among these, $LiBO_2$ (lithium metaborate) is more preferred. The amount of the additional material 24 added is preferably in the range of 0.05% by weight to 10% by weight. An amount added of 0.05% by weight or more preferably results in a stronger orientation effect. At an amount added of 10% by weight or less, the additional material is less likely to remain after firing, which is preferred. Examples of the lead-containing material include $Pb(Zr,Ti)O_3$, $Pb(Mg,Nb)(Zr,Ti)O_3$, $Pb(Ni,Nb)(Zr,Ti)O_3$, $Pb(Zn,Nb)(Zr,Ti)O_3$, $Pb(Yb,Nb)(Zr,Ti)O_3$, $(Pb,Sr)(Zr,Ti)O_3$, $(Pb,Ba)(Zr,Ti)O_3$, $(Pb,La)(Zr,Ti)O_3$, $(Bi,Pb)(Ni,Nb)(Zr,Ti)O_3$, $(Bi,Pb)(Mg,Nb)(Zr,Ti)O_3$, $(Bi,Pb)(Zn,Nb)(Zr,Ti)O_3$, and $(Pb,Sr,La)(Mg,Ni,Nb)(Zr,Ti)O_3$. One or more of these materials may be used. In addition, raw materials (for example, hydroxides and oxides) that will have these compositions after firing may be used. As a mixing method, a common method may be employed. An example thereof is ball milling. Specifically, predetermined amounts of raw materials, balls, and an organic solvent are charged into a ball mill. The mixture is rotated for a predetermined time to prepare a mixed slurry. The solvent in the mixed slurry is removed by evaporation or filtration, thereby affording the mixed material.

In the mixing step, a mixed material that contains the additional material containing lithium and boron, the lead-containing material, and a lithium-containing additional compound may be produced. The additional compound may be added to enhance the sinterability of the crystalline particles or the density of the matrix layer. The additional compound preferably has a lower melting point than the additional material containing lithium and boron. In this case, for example, it is possible to enhance the density of the matrix layer with the additional compound and then enhance the orientation with the additional material containing lithium and boron during the period for which the temperature is raised in the first firing step described below in detail, so that both the density and orientation can be enhanced. For example, the additional compound may be one or more of $Li_2CO_3$ and LiF. The amount of the additional compound added is preferably in the range of 0.2% by weight to 10% by weight, more preferably by weight to 6% by weight, and still more preferably 1% by weight to 3% by weight with respect to the entire mixed material. An amount of the additional compound added of 0.2% by weight or more results in the shaped body having a higher density. At an amount added of 10% by weight or less, the additional compound is unlikely to remain after firing, which is preferred.

(2) Formation Step

In this step, as illustrated in the first diagram of FIG. 1, the shaped body composed of the mixed material is formed. Examples of a method for forming the shaped body on a substrate include, but are not particularly limited to, the press-forming of the raw material powder with a mold, spray application of a slurry, a spin coating method, a doctor blade method, a method including immersing a substrate 12 in a slurry and allowing the substrate 12 to stand to sediment the particles 14, an LB method in which the particles 14 are aligned at a liquid-phase interface and then the immersed substrate 12 is pulled out, electrophoresis, and dipping. One or more of these methods may be employed.

(3) First Firing Step

In this step, as illustrated in the second diagram of FIG. 1, the shaped body 10 formed in the formation step is fired at a predetermined firing temperature to form polyhedral crystalline particles 14. The firing temperature is preferably in the range of the melting point of the additional material 24 to a temperature 300° C. higher than the melting point and preferably 900° C. to 1100° C., depending on the composition of the lead-containing material and the type of the additional material 24. The use of the additional material containing lithium and boron results in a lower temperature of formation of the polyhedral crystalline particles. The firing atmosphere is not particularly limited but may be an air atmosphere. In the first firing step, the polyhedral crystalline particles are grown owing to the effect of the additional material, thereby producing a calcined shaped body 11, which is the fired shaped body including many polyhedral particles 14. It is speculated that the reason for this is probably that the additional material containing lithium and boron promotes crystal growth of the lead-containing material in a polyhedral shape. The particles 14 preferably have a cubic shape among polyhedral shapes.

(4) Disaggregation Step

In this step, the resulting calcined shaped body 11 is disaggregated and classified to afford the particles 14. Examples of a disaggregation method include wet processes with, for example, ball mills, bead mills, wet jet mills, and ultrasonic baths, and dry processes with, for example, hammer mills, dry jet mills, and attritors. Examples of a classification method include wet processes with, for example, sieves, cyclones, centrifuges, and filters, and dry processes with, for example, sieves, vibrating sieves, cyclones, and DMA. Classification may be performed with a mesh (screen) having openings corresponding to a target particle size. For example, meshes having an opening size of 20 μm, 10 μm, 5 μm, and so forth may be used.

A method for producing the crystallographically oriented ceramic 40 from the particles 14 will be described below. The resulting particles 14 may be used as a raw material for a crystallographically oriented ceramic. The crystallographically oriented ceramic 40 may have any shape having a thickness of, for example, about 1 μm to more than 15 μm. That is, the particles 14 may be produced as an intermediate product in the production of the crystallographically oriented ceramic 40. A method for producing a crystallographically oriented ceramic according to the present invention may include (5) a template layer preparation step of preparing a template layer having uniform crystal orientation in a predetermined direction by fixing the resulting crystalline particles described above on a substrate, (6) a matrix layer formation step of forming a matrix layer on the template layer, the matrix layer being composed of the mixed material that contains the lead-containing material and the additional material containing lithium and boron, and (7) a second firing step of firing the shaped body at a predetermined firing temperature.

(5) Template Layer Preparation Step

In this step, the template layer having uniform crystal orientation in a predetermined direction is prepared. Note that the expression "the template layer having uniform crystal orientation in a predetermined direction" includes a template layer in which the crystal orientation of a certain plane (e.g., the (100) plane) in all crystals is completely uniform in a predetermined direction and a template layer in which the crystal orientation of a certain proportion, for example, 60% or more or 80% or more, of all crystals is uniform in a predetermined direction. In this step, the particles 14 may be arranged and fixed to the substrate 12. For example, a template layer 19 may be prepared by fixing the particles 14 on the substrate 12 with a fixing compound by heat or a potential difference. Examples of the fixing compound include monomers that can be polymerized by electrolytic polymerization, e.g., vinyl monomers, such as styrene and N-vinylcarbazole, aromatic compounds, such as aniline and phenol, and heterocyclic compounds, such as pyrrole, thiophene, and furan; and thermoplastic electrodeposition materials, e.g., carbon-based polymers, such as epoxy resins, polyimide resins, polyamide-imide resins, and acrylic resins, silicon-based polymers such as silicone resins, and nanoparticles having charged surfaces on which a dispersant is adsorbed, the nanoparticles being composed of oxides such as alumina. The substrate 12 is not particularly limited so long as the particles 14 can be arranged on a surface of the substrate 12. Examples of a material for the substrate include glass, single crystals, ceramic materials, resins, and metals. One or more of these materials may be used. Examples of a material for a glass substrate include quartz and non-alkali glass. Examples of a material for a single-crystal substrate include silicon, gallium arsenide, silicon carbide, alumina, and strontium titanate. Examples of a material for a ceramic substrate include stabilized zirconium oxide, aluminum oxide, magnesium oxide, mullite, aluminum nitride, and silicon nitride. Examples of a material for a resin substrate include epoxy-based resins and polyester-based resins. Examples of a material for a metal substrate include stainless steel, aluminum, and platinum. In addition, the metal may be coated with an insulating resin. The template layer 19 may be directly formed without immersing the substrate 12 in a solution. Alternatively, the template layer 19 may be formed by immersing the substrate 12 in a solution (slurry) containing the particles 14. Examples of the former method include a spray application method, a spin coating method, and a doctor blade method. One or more of these methods may be employed. Examples of the latter method include a method including immersing the substrate 12 in a slurry in which the particles 14 are dispersed and allowing the substrate 12 to stand to sediment the particles 14, an LB method in which the particles 14 are aligned at a liquid-phase interface and then the immersed substrate 12 is pulled out, electrophoresis, and dipping. One or more of these methods may be employed.

(6) Matrix Layer Formation Step

In this step, a shaped body including the matrix layer arranged on the template layer is formed, the matrix layer being composed of a mixed material that contains the lead-containing material and the additional material 24 containing lithium and boron. As the additional material 24 containing lithium and boron, the foregoing materials may be used. As the lead-containing material, any one of the materials described above may be used in response to a target composition and the composition of the particles 14. Examples of a method for forming the matrix layer include, but are not particularly limited to, a spray application method, a spin coating method, a doctor blade method, a method including immersing the substrate 12 in a slurry in which the particles 14 are dispersed and allowing the substrate 12 to stand to sediment the particles 14, an LB method in which the particles 14 are aligned at a liquid-phase interface and then the immersed substrate 12 is pulled out, electrophoresis, and dipping. One or more of these methods may be employed.

In this matrix layer formation step, a shaped body including a matrix layer arranged on the template layer may be formed, the matrix layer being composed of a mixed material that contains a lead-containing material, an additional material containing lithium and boron, and an additional compound containing lithium. The additional compound may be added to enhance the sinterability of the matrix layer or the density of the matrix layer. The additional compound preferably has a lower melting point than the additional material containing lithium and boron. In this case, for example, it is possible to enhance the density of the matrix layer with the additional compound and then enhance the orientation with the additional material containing lithium and boron during the period for which the temperature is raised in the firing step, so that both the density and orientation can be enhanced. For example, the additional compound may be one or more of $Li_2CO_3$ and LiF. The amount of the additional compound added is preferably in the range of 0.2% by weight to 10% by weight, more preferably 1% by weight to 6% by weight, and still more preferably 1% by weight to 3% by weight with respect to the entire matrix layer. An amount of the additional compound added of 0.2% by weight or more results in the matrix layer having a higher density. At an amount added of 10% by weight or less, the additional compound is unlikely to remain after firing, which is preferred.

(7) Second Firing Step

In this step, a shaped body 30 including a matrix layer 22 is fired at a predetermined temperature, and the template layer 19 and a matrix layer 22 are formed into a piezoelectric/electrostrictive body 26. The firing temperature is preferably in the range of the melting point of the additional material 24 to a temperature 300° C. higher than the melting point, depending on the composition of the crystallographically oriented ceramic 40. Firing is preferably performed at 900° C. to 1100° C. The use of the additional material containing lithium and boron results in a reduction in the temperature at which the crystals are oriented. The firing atmosphere is not particularly limited but may be an air atmosphere. In the second firing step, crystals of the matrix layer 22 are grown along the uniform crystal orientation of the template layer 19 in the predetermined direction owing to the effect of the additional material. In this way, the substrate 12 including the template layer 19 and the matrix layer 22 formed on the surface thereof is fired, affording the crystallographically oriented ceramic 40 provided with the piezoelectric/electrostrictive body 26 having uniform crystal orientation in a predetermined direction. It is speculated that the reason for this is that the additional material containing lithium and boron functions to promote the grain growth of the lead-containing material in such a manner that grains of the lead-containing material have a polyhedral shape.

In the method for producing the particles 14 according to this embodiment, it is possible to more easily produce a ceramic with a higher degree of orientation by adding the additional material containing lithium and boron and performing firing. Furthermore, in the method for producing the crystallographically oriented ceramic 40 according to this embodiment, it is possible to more easily produce a highly oriented ceramic by forming the matrix layer containing the additional material on the template layer having uniform crystal orientation and performing firing. More specifically, it is possible to produce template particles of a PZT-based multicomponent system (e.g., PMN-PT-PZ, PNN-PT-PZ, PZN-PT-PZ, or PMN-PNN-PT-PZ) by a solid-phase method, which is simple, has good composition controllability, and can provide a ceramic with high crystallinity compared with a solution method and gas-phase method. The template particles have heat resistance and crystallinity that can be used in reactive templated grain growth (RTGG) or templated grain growth (TGG). Each of the template particles has an aspect ratio of about 1. Oriented articles having various shapes including sheet-like shapes can be produced in combination with an arrangement technique. Furthermore, according to the present invention, a compound containing Li and B is added to isotropic crystals, which are formed into sphere-like particles by a normal heat treatment and are inherently difficult to be used as an orientation template, and then the resulting mixture is fired, resulting in crystalline particles oriented in a specific plane. The particles are arranged by an arrangement technique such as an LB method and thus function as a template aggregate having uniform crystal orientation. In particular, a PZT-based system is preferentially oriented in the {100} planes, which is preferred. Furthermore, the additional material containing lithium and boron evaporates easily during firing and is unlikely to remain in the crystallographically oriented ceramic 40, thus resulting in the production of the crystallographically oriented ceramic 40 with higher purity.

The present invention is not limited to the above embodiment. Various modifications may be made within the technical scope of the present invention.

For example, in the foregoing embodiment, although the method includes the formation step of forming the shaped body composed of the mixed material, the formation step may be omitted. In this case, in the first firing step, the mixed material itself is fired. In the first firing step, for example, firing may be performed with the mixed material placed in a crucible or sagger. In this case, it is also possible to produce the polyhedral particles 14 containing lead and use them. From the viewpoint of producing stronger crystalline particles, preferably, the formation step is performed, and then the resulting shaped body is fired.

In the foregoing embodiment, although the method includes the disaggregation step of disaggregating the calcined shaped body 11, the disaggregation step may be omitted. In this case, when the crystallographically oriented ceramic 40 is produced, the calcined components 11 and the matrix layers 22 may be alternately stacked and fired, thereby resulting in the crystallographically oriented ceramic 40. In this case, it is also possible to produce the polyhedral particles 14 containing lead and use them.

Furthermore, after the second firing step, a post-annealing step of removing the remaining additional material 24 by heating may be performed. With respect to post-annealing conditions, for example, the post-annealing may be performed under the same temperature, holding time, and atmospheric conditions as those in the firing step. The shaped body may be held at a temperature lower than the firing temperature, for example, at a temperature of 700° C. to 1000° C., for prolonged periods of time. Furthermore, the post-annealing may be performed in an atmosphere such that the additional material is easily evaporated by adjusting the oxygen partial pressure. This permits the prevention of the presence of impurity-like substances in the piezoelectric/electrostrictive body 26, thus resulting in higher piezoelectric/electrostrictive properties.

EXAMPLES

Specific examples of the production of the particles 14 and the crystallographically oriented ceramic 40 will be described below as Experimental Examples.

Experimental Example 1

Figure 2:
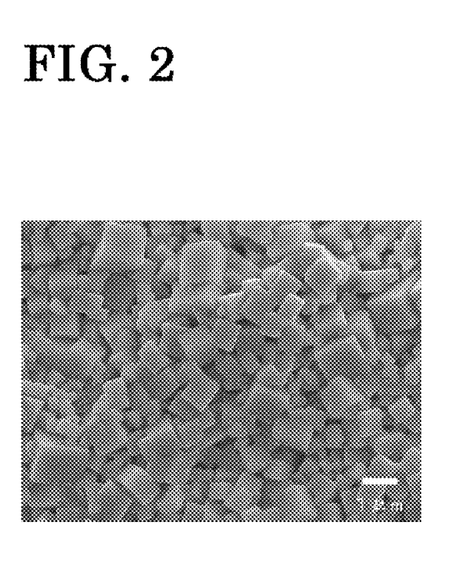
FIG. 2 shows a SEM photograph in Experimental Example 1.

First, 1% by weight of $LiBO_2$ (manufactured by Kojundo Chemical Lab. Co., Ltd.) was added to a $Pb(Mg_{1/3}Nb_{2/3})_{0.2}Zr_{0.37}Ti_{0.43}O_3$ powder with a specific surface area of 5 $m^2/g$. The resulting mixture was subjected to a mixing treatment using acetone serving as a solvent with a ball mill for 16 hours to form a slurry. The solvent was evaporated with a dryer, thereby affording a mixed powder. The mixed powder was charged into a magnesia sagger in such a manner that the height of the powder charged was uniform. The mixed powder was then calcined at 900° C. The specific surface area was calculated from nitrogen adsorption by the BET method with a specific surface area analyzer (TriStar 3000, manufactured by Shimadzu Corporation). The resulting powder was subjected to dry disaggregation treatment with an atomizer (TAP-1W, manufactured by Tokyo Atomizer M.F.G. Co., Ltd). The resulting powder was passed through a 100-mesh screen, removing coarse agglomerates. SEM observation showed that the resulting powder was formed of cube-shaped particles having a side of 1 μm. The resulting powder was charged into a beaker together with water, subjected to an ultrasonic dispersion treatment with a homogenizer, and deposited on a substrate provided with an electrode placed on the bottom of the beaker. Then 0.1 M solution of sodium dodecylbenzenesulfonate (manufactured by Kanto Chemical Co., Inc.) and 0.1 M solution of pyrrole (manufactured by Kanto Chemical Co., Inc.) were added to the beaker and subjected to electrolytic polymerization on the electrode, thereby fixing the deposited particles (this is also referred to as "template particles"). The substrate on which the particles had been fixed was removed from the beaker, subjected to ultrasonic cleaning to remove an excess amount of the particles, and degreased at 500° C., thereby affording the substrate on which the template particles were arranged in a single layer. A paste containing the $Pb(Mg_{1/3}Nb_{2/3})_{0.2}Zr_{0.37}Ti_{0.43}O_3$ powder and 6% by weight of $LiBO_2$ powder was applied by spin coating onto the substrate in such a manner that the applied paste had a thickness of 2 μm. The resulting shaped body was dried at 300° C. and fired at 1000° C. for 3 hours with an electric furnace. The resulting crystallographically oriented ceramic (oriented component) was subjected to X-ray diffraction measurement. The degree of orientation was calculated by the Lotgering method and found to be 90%.

[X-ray Diffraction Measurement and Calculation of Degree of Orientation]

XRD patterns were measured by irradiating the crystal planes of the crystallographically oriented ceramics produced in Experimental Examples with X-rays using an X-ray diffractometer (X'Pert PRO MPD, manufactured by Spectris Co., Ltd.). The degrees of orientation of the pseudocubic (100) plane were determined by the Lotgering method using the measurement results. That is, the degrees of orientation of the pseudocubic (100) plane were calculated from Equation (1) using peaks corresponding to the pseudocubic (100), (110), and (111) planes. The term "pseudocubic (100)" is used to indicate that although isotropic perovskite oxides have structures, such as tetragonal, rhombic, and trigonal structures, which are slightly distorted from the cubic structure, the structures of the oxides are regarded as the cubic structure because of the slight distortion thereof and are designated by the Miller indices. According to the Lotgering method, the degree of orientation was determined by measuring an XRD pattern from the oriented plane of each of the crystallographically oriented ceramics and performing calculation using Equation (1). In Equation (1), $\Sigma I$ (hkl) represents the sum of X-ray diffraction intensities from all crystal planes (hkl) measured in the crystallographically oriented ceramic. $\Sigma I_0$(hkl) represents the sum of X-ray diffraction intensities from all crystal planes (hkl) measured in a nonoriented ceramic having the same composition as the crystallographically oriented ceramic. $\Sigma'I(HKL)$ represents the sum of X-ray diffraction intensities from crystallographically equivalent specific crystal planes (e.g., a set of planes (100)) measured in the crystallographically oriented ceramic. $\Sigma'I_0(HKL)$ represents the sum of X-ray diffraction intensities from specific crystal planes measured in the nonoriented ceramic having the same composition as the crystallographically oriented ceramic.

[Equation 1]

Degree of orientation = Equation (1)

$$\frac{\frac{\sum' I(HKL)}{\sum I(hkl)} - \frac{\sum' I_0(HKL)}{\sum I_0(hkl)}}{1 - \frac{\sum' I_0(HKL)}{\sum I_0(hkl)}} \times 100\%$$

Experimental Examples 2 to 4

Template particles according to each of Experimental Example 2 to 4 were produced in the same procedure as in Experimental Example 1, except that the orientation-promoting additive containing lithium and boron, the $Pb(Mg_{1/3}Nb_{2/3})_{0.2}Zr_{0.37}Ti_{0.43}O_3$ powder (also referred to as "piezoelectric raw material powder"), and the lithium-containing additional compound to enhance the density were mixed. Specifically, 1.0% by weight of $LiBO_2$ (manufactured by Kojundo Chemical Lab. Co., Ltd., melting point: 799° C.) serving as the orientation-promoting additive and 3.0% by weight of $Li_2CO_3$ (manufactured by Kanto Chemical Co., Inc., melting point: 730° C.) serving as the additional compound to enhance the density were added to the piezoelectric raw material powder. The resulting template particles was defined as particles obtained in Experimental Example 2. Furthermore, 0.2% by weight of $Li_2B_4O_7$ (manufactured by Kojundo Chemical Lab. Co., Ltd., melting point: 886° C.) serving as the orientation-promoting additive and 3.0% by weight of LiF (manufactured by Kojundo Chemical Lab. Co., Ltd., melting point: 851° C.) serving as the additional compound to enhance the density were added to the piezoelectric raw material powder. The resulting template particles was defined as particles obtained in Experimental Example 3. Moreover, 1.0% by weight of $LiBO_2$ (manufactured by Kojundo Chemical Lab. Co., Ltd., melting point: 799° C.) serving as the orientation-promoting additive and 3.0% by weight of LiF (manufactured by Kojundo Chemical Lab. Co., Ltd., melting point: 851° C.) serving as the additional compound to enhance the density were added to the piezoelectric raw material powder. The resulting template particles was defined as particles obtained in Experimental Example 4. The resulting template particles according to Experimental Examples 2 to 4 were subjected to a dry disaggregation treatment with an atomizer and passed through a 100-mesh screen in the same way as in Experimental Example 1. SEM observation showed that each of the resulting powder obtained in Experimental Examples 2 to 4 was formed of cube-shaped particles having a side of 1 μm.

Experimental Examples 5 to 7

A crystallographically oriented ceramic according to each of Experimental Examples 5 to 7 was produced in the same procedure as in Experimental Example 1, except that the orientation-promoting additive, the piezoelectric raw material powder, and the additional compound to enhance the density were mixed to form a corresponding one of the matrix layers. Specifically, 1.0% by weight of $LiBO_2$ (manufactured by Kojundo Chemical Lab. Co., Ltd., melting point: 799° C.) serving as the orientation-promoting additive and 3.0% by weight of $Li_2CO_3$ (manufactured by Kanto Chemical Co., Inc., melting point: 730° C.) serving as the additional compound to enhance the density were added to the piezoelectric raw material powder. The resulting crystallographically oriented ceramic was defined as a ceramic obtained in Experimental Example 5. Furthermore, 0.2% by weight of $Li_2B_4O_7$ (manufactured by Kojundo Chemical Lab. Co., Ltd., melting point: 886° C.) serving as the orientation-promoting additive and 3.0% by weight of LiF (manufactured by Kojundo Chemical Lab. Co., Ltd., melting point: 851° C.) serving as the additional compound to enhance the density were added to the piezoelectric raw material powder. The resulting crystallographically oriented ceramic was defined as a ceramic obtained in Experimental Example 6. Moreover, 1.0% by weight of $LiBO_2$ (manufactured by Kojundo Chemical Lab. Co., Ltd., melting point: 799° C.) serving as the orientation-promoting additive and 3.0% by weight of LiF (manufactured by Kojundo Chemical Lab. Co., Ltd., melting point: 851° C.) serving as the additional compound to enhance the density were added to the piezoelectric raw material powder. The resulting crystallographically oriented ceramic was defined as a ceramic obtained in Experimental Example 7. The degrees (%) of orientation of the ceramics produced in Experimental Examples 5 to 7 were also measured.

[Calculation of In-Plane Coverage]

The microstructures of the ceramics produced in Experimental Examples 1 and 5 to 7 were observed with a scanning electron microscope (JSM-7000F, manufactured by JEOL Ltd). In-plane coverage (%) serving as an indicator of the density was determined from the observation results. First, any area having a size of 100 μm×100 μm observed with the SEM was chosen. Void regions were determined by image analysis based on a difference in contrast. Next, a void area A was subtracted from the total area S to determine the area C of a region (region of the crystallographically oriented ceramic) other than the voids. The resulting area C was divided by the total area S and multiplied by 100. The resulting value was defined as the in-plane coverage. That is, in-plane coverage (%)=(S−A)/S×100. Table 1 shows the degrees of orientation and the in-plane coverage of the ceramics produced in Experimental Examples 1 and 5 to 7.

TABLE 1

| Crystallographically oriented ceramic | Degree of Orientation (%) | In-Plane Coverage (%) |
|---|---|---|
| Experimental Example 1 | 90 | 94 |
| Experimental Example 5 | 93 | 100 |
| Experimental Example 6 | 90 | 100 |
| Experimental Example 7 | 69 | 100 |

Experimental Result

As shown in Table 1, in each of Experimental Examples 5 to 7, the in-plane coverage was 100. The results demonstrated that the addition of the orientation-promoting additive and the lithium-containing additional compound (e.g., $Li_2CO_3$ or LiF) to enhance the sinterability when the crystallographically oriented ceramic was produced resulted in a higher degree of orientation and a higher density. In particular, the results demonstrated that in the case where the melting point of the sinterability-enhancing additional compound was lower than that of the orientation-promoting additive, the degree of orientation and the density were increased. It was speculated that the reason for this was that during the period for which the temperature was raised in the firing step, the sinterability-enhancing additional compound resulted in an increase in density, and then the orientation-promoting additive functioned to allow the ceramic to be oriented in a specific plane. It was speculated that in the case where the melting point of the sinterability-enhancing additional compound was higher than that of the orientation-promoting additive, oriented crystals were partially sacrificed for sintering, thereby leading to a slightly low degree of orientation. Note that the results demonstrated that in Examples 5 to 7, the additive containing lithium and boron resulted in a higher degree of orientation, regardless of the melting points of the orientation-promoting additive and the sinterability-enhancing additional compound.

Reference Example 1

A $Pb(Mg_{1/3}Nb_{2/3})_{0.2}Zr_{0.37}Ti_{0.43}O_3$ powder with a specific surface area of 5 m/g was added to a solvent, which was an equal volume mixture of toluene and isopropyl alcohol. A butyral-based binder (BM-2, manufactured by Sekisui Chemical Co., Ltd.), a dispersant (SPO-30, manufactured by Kao Corporation), and a plasticizer (DOP, manufactured by Kurogane Kasei Co., Ltd.) were added thereto, thereby forming a slurry-like solution. The resulting slurry was subjected to a defoaming treatment. The defoamed slurry was formed into a sheet having a dry thickness of 5 μm on a PET film by a doctor blade method. The resulting sheet was degreased at 600° C. and fired at 1100° C. for 5 hours, thereby forming a fired material. The fired material was passed through a 300-mesh screen, affording plate-like polycrystalline particles. Then 20% by weight of the resulting particles were mixed with the $Pb(Mg_{1/3}Nb_{2/3})_{0.2}Zr_{0.37}Ti_{0.43}O_3$ powder. The resulting mixture was formed into a sheet in the same way as above. The sheet was degreased at 600° C. and fired at 1250° C. for 3 hours, thereby forming an oriented material. The resulting oriented material was subjected to X-ray diffraction measurement.

The degree of orientation was calculated by the Lotgering method and found to be 70%.

Reference Experiment

Figure 3:
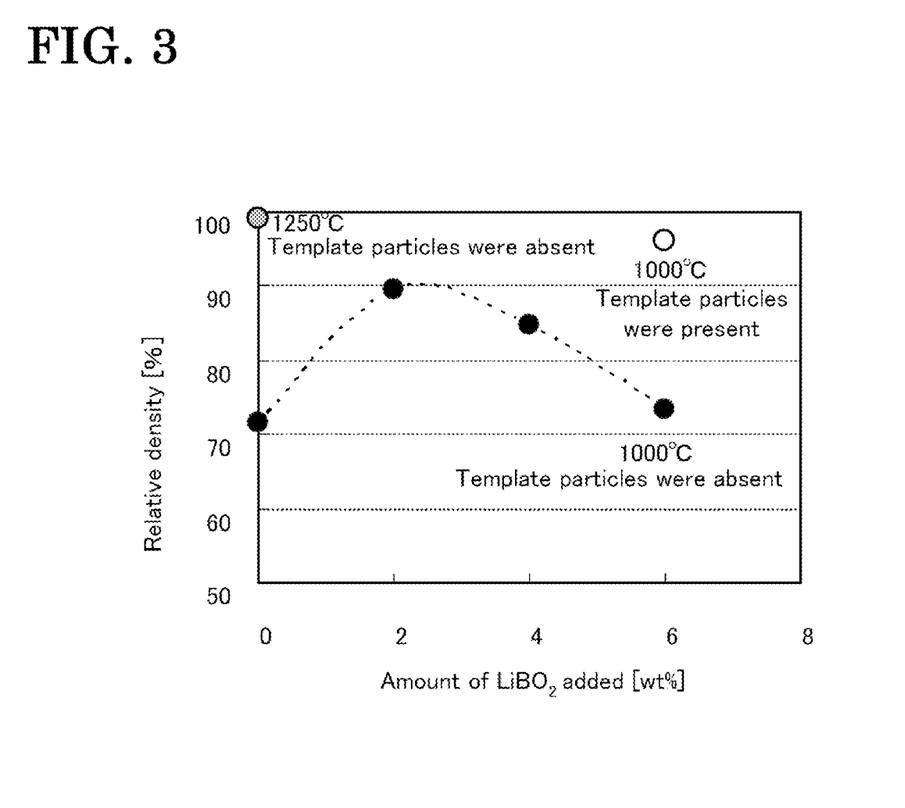
FIG. 3 is a graph illustrating the relationship among the amount of LiBO$_2$ added, the firing temperature, and the relative density of a piezoelectric component.

Whether $LiBO_2$ can be used as a sintering aid was studied. A piezoelectric material (hereinafter, also referred to as "20PMN-80PZT") was used, the piezoelectric material containing lead magnesium niobate ($Pb(Mg,Nb)O_3$), in which 13 mol % of magnesium was substituted by nickel, and lead zirconate titanate ($Pb(Zr,Ti)O_3$) in a composition ratio of 2:8, and the piezoelectric material being produced from lead oxide (manufactured by Mitsui Mining & Smelting Co., Ltd.), titanium oxide (manufactured by Ishihara Sangyo Kaisha, Ltd.), zirconium oxide (manufactured by Nippon Denko Co., Ltd), magnesium carbonate (manufactured by Konoshima Chemical Co., Ltd.), niobium oxide (manufactured by Mitsui Mining & Smelting Co., Ltd.), and nickel oxide (manufactured by Seido Chemical Industry Co., Ltd). $LiBO_2$ (manufactured by Kojundo Chemical Lab. Co., Ltd.) was added to the powder having a composition of 20PMN-80PZT in an amount of 0% by weight, 2% weight, 4% by weight, or 6% by weight. The mixture was formed into pellets. The pellets were fired at 1000° C. Separately, the powder having a composition of 20PMN-80PZT and being free from $LiBC_2$ was formed into pellets. The pellets were fired at 1250° C. In addition, 6% by weight of $LiBO_2$ was added to the powder having a composition of 20PMN-80PZT. The mixture was fired at 1000° C. using the template particles produced in Experimental Example 1. The relative densities with respect to the true density of the resulting samples were determined. Table 2 shows the results as reference data. FIG. 3 is a graph illustrating the relationship among the amount of $LiBO_2$ added, the relative density, and the firing temperature. The results demonstrated that in the case where the template particles were absent, each of the $LiBO_2$-containing samples had a relative density of 90 or less; hence, $LiBO_2$ did not function as a sintering aid to increase the sintered density. Furthermore, it was speculated that the presence of the template particles resulted in an increase in relative density; hence, $LiBO_2$ functioned as an orienting aid.

TABLE 2

| $LiBO_2$ (% by weight) | Relative density (%) (Template particles were absent) | | Relative density (%) (Template particles were present) |
|---|---|---|---|
| | Fired at 1000° C. | Fired at 1250° C. | Fired at 1000° C. |
| 0 | 71 | 99 | |
| 2 | 90 | | |
| 4 | 85 | | |
| 6 | 73 | | 96 |

The present application claims the benefit of the priority from Japanese Patent Application No. 2009-167721 filed on Jul. 16, 2009, and Japanese Patent Application No. 2010-113576 filed on May 17, 2010, the entire contents of both of which are incorporated herein by reference.

What is claimed is:
1. A method for producing crystalline particles, comprising:
   a mixing step of producing a mixed material containing a lead-containing material and an additional material containing lithium and boron, wherein the additional material is at least one of $LiBO_2$, $Li_2B_4O_7$, $LiB(OH)_4$, $Li_3BO_3$, $Li_6B_4O_9$, $LiB_3O_5$, and $Li_2B_8O_{13}$; and
   a first firing step of firing the mixed material at a predetermined firing temperature to form polyhedral crystalline particles.
2. The method for producing crystalline particles according to claim 1, further comprising:
   a formation step of forming a shaped body composed of the mixed material after the mixing step and before the first firing step,
   wherein in the first firing step, the shaped body is fired.
3. The method for producing crystalline particles according to claim 1, wherein in the mixing step, a mixed material that contains the additional material containing lithium and boron, the lead-containing material, and an additional compound containing lithium is produced, the additional compound having a lower melting point than the additional material.
4. The method for producing crystalline particles according to claim 3, wherein in the mixing step, at least one of $Li_2CO_3$ and LiF is mixed as the additional compound.

5. The method for producing an crystalline particles according to claim 1, wherein in the first firing step, firing is performed at 900° C. to 1100° C.

6. A method for producing a crystallographically oriented ceramic, comprising:
- a preparation step of preparing a template layer having uniform crystal orientation in a predetermined direction by fixing crystalline particles composed of a lead-containing material on a substrate, the crystalline particles being produced by the method for producing crystalline particles according to claim 1;
- a formation step of forming a shaped body including a matrix layer arranged on the template layer, the matrix layer being composed of a mixed material that contains a lead-containing material and an additional material containing lithium and boron; and
- a second firing step of firing the shaped body formed in the formation step at a predetermined firing temperature.

7. The method for producing a crystallographically oriented ceramic according to claim 6, wherein in the formation step, the shaped body including the matrix layer arranged on the template layer is formed, the matrix layer being composed of a mixed material that contains the lead-containing material, the additional material containing lithium and boron, and an additional compound containing lithium and having a lower melting point than the additional material.

8. The method for producing crystalline particles according to claim 1, wherein the additional material containing lithium and boron is present in an amount of 0.05 to 10% by weight.

* * * * *